Aug. 13, 1957 L. MOLES 2,802,759
METHOD FOR PRODUCING EVAPORATION FUSED JUNCTION SEMICONDUCTOR DEVICES
Filed June 28, 1955
Fig. 1.
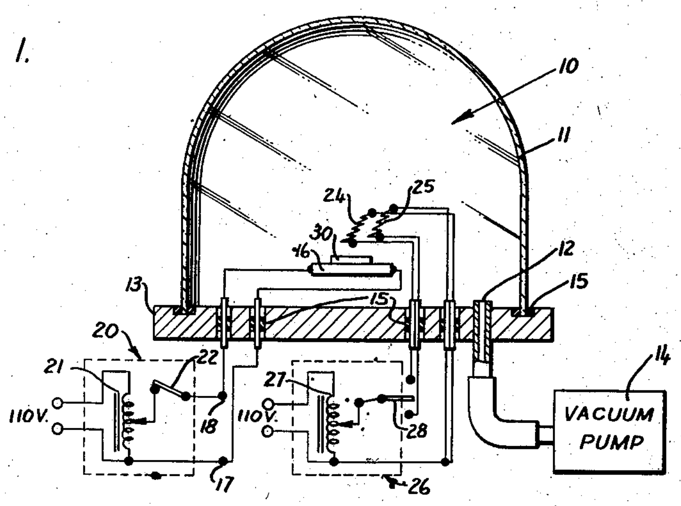
Fig. 2.
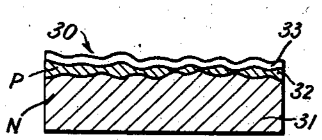
Fig. 3.
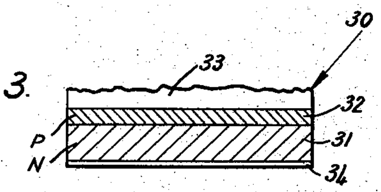
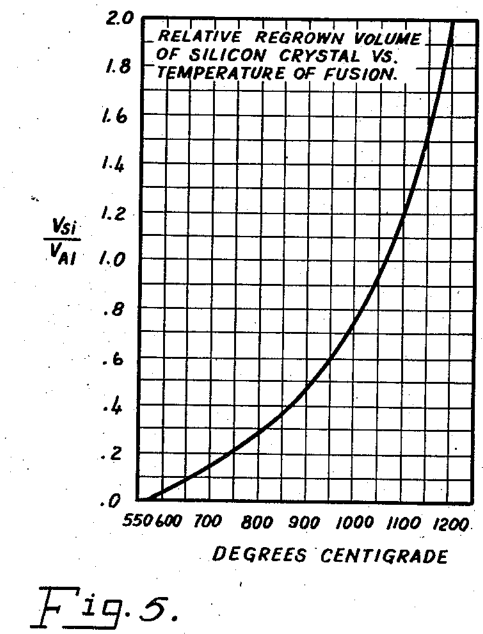
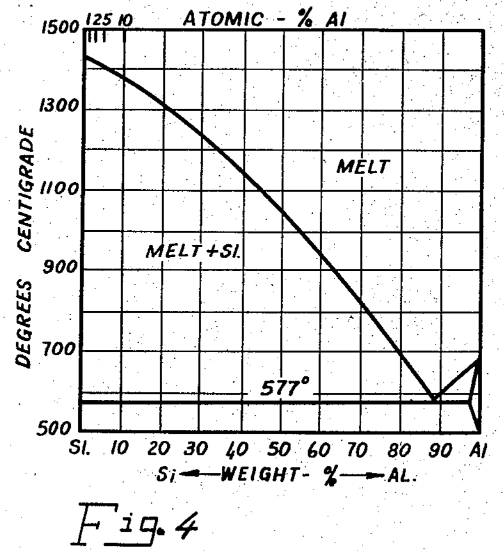
Fig. 4
Fig. 5.
LESLIE MOLES
INVENTOR
BY Henry Heyman
ATTORNEY United States Patent Office 2,802,759 Patented Aug. 13, 1957

2,802,759

METHOD FOR PRODUCING EVAPORATION FUSED JUNCTION SEMICONDUCTOR DEVICES

Leslie Moles, Los Angeles, Calif., assignor to Hughes Aircraft Company, Culver City, Calif., a corporation of Delaware Application June 28, 1955, Serial No. 518,554

13 Claims. (Cl. 148—1.5)

This invention relates to semiconductor devices, and, more particularly, to fused junction semiconductor signal translating devices having a broad area P-N junction, and to an improved evaporation method of producing broad area fused junction semiconductor devices.

In the semiconductor art, a region of semiconductor material containing an excess of donor impurities and having an excess of free electrons is considered to be an N-type region, while a P-type region is one containing an excess of acceptor impurities resulting in a deficit of electrons, or stated differently, an excess of holes. When a continuous solid specimen of semiconductor material has an N-type region adjacent a P-type region, the boundary between the two regions is termed a P-N (or N-P) specimen and the specimen of semiconductor material is termed a P-N junction semiconductor device. Such a P-N junction device may be used as a rectifier. A specimen having two N-type regions separated by a P-type region, for example, is termed an N-P-N junction semiconductor device or transistor, while a specimen having two P-type regions separated by an N-type region is termed a P-N-P junction semi-conductor device or transistor.

The term, "monatomic semiconductor material," as utilized herein, is considered generic to both germanium and silicon, and is employed to distinguish these semiconductors from metallic oxide semiconductors, such as copper oxide and other semiconductors, consisting essentially of chemical compounds.

The term "active impurity" is used to denote those impurities which affect the electrical rectification characteristic of monatomic semiconductor material, as distinguishable from other impurities which have no appreciable effect upon these characteristics. Active impurities are ordinarily classified either as donor impurities—such as phosphorus, arsenic, and antimony—or as acceptor impurities, such as boron, aluminum, gallium, and indium.

The term "solvent metal" is used in this specification to describe those metals which when in the liquid state become solvents for the semiconductor material which is under consideration and will therefore dissolve areas of semiconductor material which are in contact with the solvent metal. A solvent metal may be a primary element or it may be an alloy.

A method of producing very broad area P-N junctions in semiconductor bodies has been disclosed and claimed in the copending application of Joseph Maserjian, filed February 2, 1955, Serial No. 490,599, now U. S. Patent No. 2,789,068 entitled, "Evaporation-Fused Junction Semiconductor Devices," assigned to the assignee of the present application. The method of the Maserjian application comprises the steps of heating a monatomic semiconductor crystal body of a predetermined conductivity type; evaporating a mass of solvent metal, including an active impurity of the type which will convert the body to the desired conductivity type, onto the surface of the semiconductor body to form a molten layer of substantial thickness of the solvent metal upon the surface of the body and to dissolve a layer of the surface of the semiconductor body in the molten layer of solvent metal, and cooling the semiconductor body to cause the dissolved semiconductor material to precipitate, together with some atoms of the active impurity, upon the semiconductor body to form an integral regrown crystal region of opposite conductivity type to the semiconductor body. The method disclosed by the above copending application may also be utilized to create a superior ohmic contact on the semiconductor body.

The preferred embodiment of the method disclosed in the Maserjian application utilizes aluminum as the solvent metal which is deposited upon the surface of a semiconductor crystal body under accurately defined conditions and at a temperature above the eutectic temperature of aluminum and the crystal material to cause dissolution of a portion of a semiconductor body followed by regrowth to form an integral regrown crystal region of the desired conductivity type. Since aluminum is used as the solvent metal it also serves as the active impurity and forms an N-type regrown region upon a P-type crystal body. The method of the Maserjian application yields excellent results and forms clearly defined P-N junctions. However, it has been found that for reasons which are not completely understood, an incomplete wetting of the surface of the crystal body occasionally results after the aluminum has been evaporated onto the surface. When this occurs, the application of aluminum to the surface of a semiconductor wafer, such as for example silicon at the fusion temperature results in a non-uniform deposit of aluminum upon the wafer and the molten aluminum has a tendency to coalesce into small lumpy deposits. Strains are, thus, created in the wafer upon cooling. These are of sufficient magnitude to induce minute cracks in the wafer and render them unsatisfactory for use as semiconductor devices. If a second mass of aluminum is evaporated onto such a surface in an attempt to make the deposit more uniform, the aluminum surface becomes more uneven and there is no improvement in the results.

In accordance with the present invention, the Maserjian evaporation-fused junction method is modified to obviate this difficulty which may occasionally occur.

Accordingly, it is an object of the present invention to provide an improved method of producing broad area P-N junctions.

It is another object of the present invention to provide semiconductor devices having P-N junction areas which are not limited in area except by the size of the crystal which is available.

It is another object of the present invention to provide a method of producing rectifier barriers in semiconductor crystal bodies which is simple and lends itself to mass production.

It is another object of the present invention to provide a fusion method of producing a broad area P-N junction which is accurately controllable.

It is a further object of the present invention to provide an improved method of producing broad area P-N junctions upon semiconductor crystal bodies which may be later divided to produce a plurality of rectifying crystals for semiconductor devices.

Still a further object of the present invention is to provide an improved fusion method of producing broad area P-N junctions by insuring the even deposit, by evaporation, of a substantial mass of solvent metal upon the surface of the semiconductor body.

The method of the present invention comprises the steps of heating a monatomic semiconductor crystal body of a predetermined conductivity type to a temperature above the eutectic temperature of the semiconductor crystal and a solvent metal; evaporating a mass of the solvent metal including an active impurity of the type which will convert the body to the desired conductivity type onto the surface of the semiconductor crystal to form a molten layer of substantial thickness of the solvent metal upon the surface of the crystal and to dissolve a layer of the surface in a molten layer of solvent metal; cooling the semiconductor body to a temperature below the eutectic temperature of the semiconductor crystal and solvent metal; heating the semiconductor body to a temperature above the eutectic temperature; evaporating a second mass of the solvent metal and active impurity upon the surface of the semiconductor body and solvent metal which has been previously deposited; and cooling the semiconductor body to cause the dissolved semiconductor material to precipitate, together with some atoms of the active impurity upon the semiconductor body to form an integral regrown crystal region of opposite conductivity type to the semiconductor body. The present method may also be utilized to create a superior ohmic contact on the semiconductor body.

The novel features which are believed to be characteristic of the invention, both as to its organization and method of operation, together with further objects and advantages thereof, will be better understood from the following description considered in connection with the accompanying drawings in which an embodiment of the invention is illustrated by way of example. It is to be expressly understood, however, that the drawings are for the purpose of illustration and description only and are not intended as a definition of the limits of the invention.

Fig. 1 is a schematic diagram, partly in section, of one form of apparatus for producing fused junction semiconductor devices according to the present invention;

Fig. 2 is a sectional schematic diagram of a fused junction semiconductor body illustrating the appearance of the deposited mass of solvent metal when the solvent metal has failed to completely wet the surface of the semiconductor crystal;

Fig. 3 is a schematic diagram in section of a fused junction semiconductor body illustrating the appearance of the deposited mass of solvent metal that has been deposited in accordance with the method of the present invention;

Fig. 4 is a binary phase diagram which illustrates the liquid-solid equilibrium phase relationship between aluminum and silicon for a range of temperatures between 500° C. and 1500° C.; and Fig. 5 is a graph illustrating the ratio between the volume of the silicon regrown crystal region and the volume of aluminum evaporated onto the silicon surface versus the fusion temperature used in the method of the present invention.

Referring now to the drawings wherein like reference characters designate like or corresponding parts throughout the several views, there is shown in Fig. 1 one form of apparatus for producing fused junction semiconductor devices according to the method of this invention. The apparatus comprises a vacuum chamber 10 defined by a bell jar 11 and a base 13 having an exhaust port 12 therethrough to which a vacuum pump 14 is connected. Positioned within the chamber 10 is a heating platform 16 which may be supported within the chamber by any suitable supporting means, not shown for purposes of clarity. The platform 16 in the presently preferred embodiment of this invention is a graphite heating element which is connected outside the chamber 10 to two output terminals 17 and 18, respectively, of an electrical power source 20. The electrical power source 20 may include any conventional electrical circuit which is controllable for supplying a predetermined amount of electrical energy to the graphite heating platform 16. As shown in Fig. 1, for example, power source 20 includes an auto transformer generally designated 21 which is connected across a 110 volt alternating current source, as indicated, and to a switch 22 through which a potential output from auto transformer 21 may be applied to the heating platform 16.

Positioned within the bell jar 11 above the heating platform 16 are a first and second resistance heating platform 16 are a first and second resistance heating filament 24, 25 connected to a second electrical power source 26 which may again be any conventional electrical circuit which is controllable for supplying a predetermined amount of electrical energy to the resistance heating filaments 24, 25. A two-way switch 28 allows electrical energy to be supplied selectively to the resistance heating filaments 24, 25 independently. Second power source 26 also includes an auto transformer 27 which is connected across a 110-volt alternating current source and the output which may be connected to filaments 24, 25 through the switch 28.

For purposes of illustration, the operation of the apparatus shown in Fig. 1 will be described with respect to the production of a fused silicon P-N junction in which the semiconductor crystal is N-type silicon, while the regrown region is P-type. It will be recognized, however, that the operational steps to be described may also be employed for producing fused germanium P-N junctions and P-N junctions in both silicon and germanium in which the semiconductor crystal is P-type and the regrown region is N-type.

In producing a fused P-N junction in silicon by the method of the present invention, aluminum is used in the preferred embodiment as a combined solvent metal and active impurity. In addition to being an acceptor impurity, aluminum allows a wide tolerance in the temperatures used in the method and exhibits very little diffusion into the silicon, thereby providing a clearly-defined P-N junction. Although aluminum is used as a combined solvent metal and active impurity in the present embodiment described hereinafter, it will be apparent to those skilled in the art that other solvent metals, for example, gold, platinum, silver, and tin, may be used when combined with the proper active impurity. The solvent metal may be a primary element or an alloy which has a relatively low melting point or at least a low eutectic temperature with the semiconductor material, and must be a metal capable of forming a eutectic alloy with the silicon or germanium which is used as the semiconductor material. The active impurities which may be used in the present method are those ordinarily classified either as donor impurities, including phosphorus, arsenic, and antimony, or as acceptor impurities including aluminum, gallium, and indium. The solvent metal and active impurities will be determined by the conductivity type of the crystal region to be regrown, for example, an alloy of gold and antimony may be used for N-type regrown regions on P-type bodies.

Referring to Fig. 1, an N-type silicon body 30 is preferably a silicon single crystal which has been cut to a slab of predetermined thickness and which has been crystallographically oriented so that its upper and lower surfaces, as viewed in Fig. 1, are the (111) surface planes of the crystal. The semiconductor body may be of any desired area which is most generally determined by the size of the parent single crystal from which the slab is cut. In the present embodiment, a silicon body approximately ½" in diameter is used. Crystallographic orientation of the specimen is not necessary, but is desirable to promote the growth of planar P-N junctions within the specimen during the fusion operation which will be described hereinafter. At present, it appears to be preferable to employ the (111) surface plane for carrying out the method of this invention, the theory being that the relatively high atomic density of the crystal on this particular plane permits better control of subsequent operations. It should be pointed out, however, that other relatively dense crystallographic surface planes, such as the (110), (100), and (112) plane, may be employed satisfactorily in carrying out the methods of this invention.

The silicon semiconductor body 30 is lapped to a predetermined thickness, for example, of the order of 0.025 of an inch, to remove surface damage produced by the cutting operaiton and to provide a specimen of uniform thickness. One commercially available lapping compound which has been satisfactorily employed for performing the lapping operation is 302 mesh alundum abrasive. After the lapping operation has been performed, the semiconductor body is preferably etched in any one of several suitable etchants known to the art to remove surface imperfections. The etching step may be carried out, for example, by immersing the semiconductor body for forty seconds in a solution containing equal parts of nitric acid, hydrochloric acid, and acetic acid. The wafer is then rinsed in distilled water, followed by a second rinse in absolute methyl alcohol.

With the bell jar 11 removed, the semiconductor body 30 is placed upon the heating platform 16 which is a graphite heating element. Graphite is used as the material for the heating platform 16 because of its relative lack of chemical activity with silicon at elevated temperatures.

The first and second resistance heating filaments 24, 25 are positioned within the evacuated chamber 10 approximately ½" above the upper surface of the semiconductor body 30. The filaments presently used are saw toothed in form lying in a plane substantially perpendicular to the plane of the surface of the semiconductor body, and are made from triple strand 20-mil diameter tungsten wire. A predetermined quantity of aluminum, determined as described hereinafter, is placed on the filaments in the form of strips ⅛" by ¹⁄₁₆" by ⅜" in length. These strips are formed around the filaments at spaced intervals. Although tungsten filaments are utilized in this embodiment, other means which will be wet by the solvent metal and which may be heated to evaporate the solvent metal therefrom may be used.

The bell jar 11 is then placed upon the base 13 where the chamber is sealed by gaskets 15 and the chamber is evacuated to a pressure of less than $10^{-4}$ millimeters of mercury. The graphite heating platform is raised to a temperature of the order of 700° C. by means of the source of electric current. The time required to raise the heating platform 16 and silicon body to a desired temperature is not critical, although in this embodiment of the present method about 7 minutes is required at which time the upper surface of the silicon semiconductor body is at a temperature of approximately 700° C.

After heating platform has attained the required temperature, current is passed through the first tungsten filament 24 by means of the 2-way switch 28 to raise its surface to a temperature sufficient to melt the aluminum and to cause the aluminum to wet the tungsten wire, thus forming a molten coating of aluminum upon the wire. In practice, approximately 20 amperes of current is passed through the tungsten wire until the surface of the tungsten is fully wetted and appears to glow with an orange-red color, indicating a probable surface temperature of the first element 24 of about 900° C. When the tungsten filament appears to be completely wetted and uniformly coated by the aluminum, the current in the filament is increased, for example, to 30 amperes. It may then be seen that the filament becomes incandescent to a brilliant white light and within about 10 seconds substantially all the aluminum is evaporated from the first tungsten filament 24. This is evidenced by the reappearance of the triple strands which were formerly concealed by the uniform surface of the melted alumnium. The currents through the filament 24 and through the heating platform 16 are then switched off and the semiconductor body is allowed to cool within the evacuated chamber at a controlled cooling rate of approximately 1.0° C. per second until the heating platform reaches a temperature which is below the eutectic temperature of aluminum and silicon. In the presently preferred embodiment for the silicon body being used and the amount of aluminum which is deposited, the heating platform is cooled to a temperature of the order of 450° C.

The graphite heating platform 16 is then again raised to a temperature of the order of 700° C. by means of the source of electric current as before. Again the time required to raise the heating platform 16 and silicon body 30 to the desired temperature is not critical, but in this embodiment of the present method, approximately 2 minutes is required, until the upper surface of the silicon body is at a temperature of approximately 700° C.

After the heating platform has attained the required temperature for the second time, the 2-way switch 28 is properly positioned and current is passed through the second tungsten filament 25 to raise its surface to a temperature, as described hereinbefore in connection with the first filament, sufficient to melt the aluminum and to cause the aluminum to wet the tungsten wire, thus forming a molten coating of aluminum upon the second filament 25.

After the second tungsten filament 25 appears to be completely wetted and uniformly coated by the aluminum, the current to the filament is increased, for example, to 30 amperes and the aluminum is evaporated from the second filament onto the upper surface of the silicon body upon which molten aluminum has been previously deposited by the evaporation from the first filament 24. The currents through the second filament and through the heating platform are then switched off and the semiconductor body is allowed to cool within the evacuated chamber at a controlled cooling rate at approximately 0.7° C. per second until the heating platform reaches the temperature of approximately 100° C. The semiconductor body is then removed from the evacuated chamber and allowed to cool at room temperature. Although the semiconductor body may be cooled at a faster rate or by uncontrolled cooling, it has been found that if the cooling has been carried out too rapidly, the filament of aluminum will tend to separate in the semiconductor body due to the expansion differences of the silicon body and the solvent metal.

Referring now to Fig. 2 there is illustrated schematically a semiconductor body 31 upon which aluminum has been evaporated without completely wetting the surface of the semiconductor body which occasionally occurs. The aluminum which has been deposited upon the upper surface coalesces into a lumpy deposit 33 which does not completely cover the surface and therefore forms a poor regrown region 32 rather than the clearly defined P-N junction which is formed as described hereinafter. The reasons for an incomplete wetting and uneven deposit which may sometimes occur are not fully understood, and the mechanism which causes the regrown region to be more clearly defined by a second evaporation after cooling below the eutectic temperature is also not clearly understood. Fig. 3 illustrates schematically a semiconductor body 31 obtained by the method described above in which, after poor results from the first evaporation, the semiconductor body and solvent metal have been cooled below the eutectic temperature, again raised above the eutectic temperature, and a second mass of solvent metal has been then evaporated upon the first deposit.

Referring to Fig. 3, since the temperature of the silicon surface, at the time the evaporations are made, is above the eutectic temperature for aluminum-silicon alloy, the molten aluminum will dissolve a substantial portion of the silicon with which it is in contact. As the silicon body is allowed to cool, the solubility of the silicon in the molten aluminum decreases and, as a result some of the dissolved silicon, together with some atoms of the aluminum which acts as the acceptor impurity, begin to precipitate out of the liquid aluminum-silicon solution, depositing preferentially on the parent N-type silicon body 31 to form a regrown P-type silicon region 32. As the temperature is further decreased, the remainder of the aluminum and dissolved silicon solidified as a layer of eutectic aluminum-silicon alloy 33 which is ohmically connected to the P-type regrown region. The P-type regrown silicon region covers the surface area of the semiconductor body 30, thus giving a fused P-N junction equal in area to the surface area of the semiconductor crystal used in the process. Thus, the only limitation in size of the P-N junction which may be produced by the present method is the size of the parent semiconductor crystal available.

The method of the present invention described above has been utilized to produce P-N junctions of the order of 1¾" in diameter. The fused P-N junctions exhibit excellent electrical characteristics. As will be apparent to those skilled in the art, the current-carrying capabilities of semiconductor devices may be greatly enlarged, since the amount of current which may be carried is proportional to the area of the P-N junction for a given current density.

In the embodiment described above, in which the single crystal silicon body 30 is of the order of 0.025 inch in thickness and ½" in diameter, the amount of aluminum evaporated from the first tungsten filament is of the order of 1 gram, and the aluminium evaporated from the second tungsten filament is of the order of 1.5 grams. The total thickness of the molten aluminum deposited on the surface of the silicon body 30 after both deposits have been made is approximately 6 mils and results in a regrown or P-type region 32 substantially equal to 1.5 mils. The rate of evaporation of the aluminum at the temperatures and currents given is about 1 gram per minute. The distance of the filament above the upper surface of the semiconductor body for a given amount of aluminum determines the thickness of the aluminum deposited on the surface and the optimum distance for a given application may be readily determined by one skilled in the art. For clarity a single first and second filament have been shown and described; however, it has been found that when the area of the silicon surface upon which the regrown region is to be formed is relatively large, or when a plurality of silicon bodies are being formed simultaneously, it is advantageous to use a plurality of filaments for each evaporation. For example, to form a P-N junction upon silicon bodies which have a total surface area of approximately 6 square inches, excellent results are achieved by dividing the aluminum to be deposited by the first exaporation among two filaments and the aluminum which is to be deposited by the second evaporation among three filaments. It will be apparent to one skilled in the art, however, that the number of filaments which are used for each evaporation is dependent upon the quantity of aluminum to be deposited and upon the area over which it is to be distributed.

In practicing the present method, using semiconductor bodies of proper quality, parameters which have been found to be critical in order to yield optimum and reproducible results are identical to those described in the copending application of Maserjian and are: temperature of the surface of the semiconductor body; the thickness of the molten film of solvent metal and active impurity deposited on the surface of the semiconductor body; and the rate of evaporation of the solvent metal and active impurity onto the surface. The rate of cooling between the first and second evaporation stages and after the fusion are not critical to the same degree as are the above parameters; however, for optimum use of the method and to obtain reproducible uniform quality of junctions, the rate of cooling should be controlled and should be substantially equal when the method is repeated.

Referring to Figs. 4 and 5, the amount of silicon which will be dissolved by the total amount of molten solvent metal deposited by the first and second evaporation is dependent upon the quantity of molten aluminum present on the surface of the semiconductor body after both evaporation stages and upon the temperature of the surface. In the presently preferred embodiment, in which aluminum is used as both the solvent metal and active impurity, the amount of silicon which will be dissolved by a predetermined amount or weight of aluminum at a given temperature can be readily determined by referring to the binary phase diagram for the alloy of aluminum and silicon which appears at page 284 of the "Metals Reference Book" by Mithalls, published by N. Y. Interscience Publishers, Inc. (1949 edition), which is substantially reproduced in Fig. 4. From the binary phase diagram for aluminum-silicon alloy, it may be seen that the range of fusion temperatures at which the present method is operating must be between the eutectic temperature of aluminum-silicon, which is 577° C., and the melting point of silicon which is 1450° C. By referring to Fig. 4, it may be seen that a layer of molten aluminum, which results after the two evaporation stages, upon the surface of the silicon body, which has a surface temperature of 600° C. will dissolve an amount of silicon equal in weight to approximately 14% of the weight of the aluminum. At 800° C., dissolved silicon will constitute about 28% of the weight of the molten aluminum which is in phase equilibrium with the solid silicon body. It has been found in practicing the method of the present invention that a temperature range between 700° C. and 900° C. for the silicon body during both evaporation stages is preferable when aluminum is used as the solvent metal and active impurity with the silicon body. Above the temperature of 900° C., penetration of the molten aluminum into the solid silicon body is rapid and excessive, causing difficulty in control and decrease in the lifetime of the carriers at the junction, which results in a decrease of forward current possible through the junction. If a fusion temperature near the eutectic temperature of the alloy is used, the rate of evaporation of the solvent metal onto the silicon surface becomes overly critical, as will be described in greater detail hereinafter. Thus, for aluminum, difficulty is encountered at fusion temperatures below approximately 700° C.

The thickness of the layer of molten solvent metal evaporated onto the surface of the semiconductor body must be substantial for each evaporation stage in order to form a fused P-N junction by the present method. In practicing this invention, evaporated thicknesses from 0.2 to 10 mils for the first and second evaporation have yielded satisfactory P-N junctions. From the foregoing description it is apparent that the thickness of the P-type region, which is regrown when aluminum is used as the solvent metal, is a function of the weight of the aluminum present and the temperature of the silicon surface, since at a given temperature the amount of silicon dissolved by the aluminum is a percentage by weight of the aluminum present. Using the binary phase diagram for the semiconductor material and solvent metal used, one skilled in the art can construct a curve such as that shown in Fig. 5 for silicon and aluminum, which shows the ratio of the volume of the silicon regrown region to the total volume of aluminum present for any given temperature in the range of operable temperature, assuming equilibrium conditions are maintained throughout the process. For example, from Fig. 5 it may be seen that at 800° C., the regrown crystal region will be 0.3 times the total volume or thickness of the molten aluminum evaporated onto the silicon surface (i. e., after the aluminum has been evaporated and deposited from both the first and second filament), while at 900° C. it will be nearly 0.5 times the total volume Thus, if a thickness of 5 mils of aluminum is evaporated onto the surface of the silicon body at 900° C., a regrown region which is 2.5 mils in thickness will be formed.

The third critical parameter in the method of the present invention is the rate of evaporation of the solvent metal and active impurity onto the surface of the semiconductor body. At a temperature of fusion, i. e., 700° C., in the described embodiment, the rate of evaporation is less critical than at a fusion temperature near the eutectic point of the semiconductor material and solvent metal alloy since the rate of penetration is greater at the higher temperature. The rate of evaporation may be easily determined, in view of what has been hereinbefore discussed, by routine experiment for particular conditions of one skilled in the art. It has been found in using aluminum and silicon that a rate of evaporation onto the silicon surface of less than 1/100 mil per second at fusion temperatures below 800° C. will not yield satisfactory results, while obviously there is no upper limit on the evaporation rate.

The production of a fused junction silicon diode according to the method of the present invention will be described in some detail to further illustrate the applicability of the present invention.

Referring now again to Figs. 1 and 3, in the production of a fused junction diode a broad area ohmic back contact is created on the single crystal silicon body 30 by utilizing the apparatus hereinbefore described and shown in Fig. 1 in accordance with the method disclosed and claimed in the copending application of Maserjian. For illustration, this silicon body is again assumed to be N-type. A predetermined quantity of gold-antimony, which is specifically 0.5 percent antimony, is wrapped around the first tungsten filament 24 for producing an ohmic contact on the N-type silicon. A solvent metal containing a donor impurity, such as phosphorus, arsenic or preferably antimony, is used. The donor impurity will, of course, not change the conductivity type of the N-type semiconductor. In practicing the present method, gold has proven eminently successful as a solvent metal. It will be apparent to one skilled in the art that gold containing an acceptor type of material may similarly be used to produce an ohmic contact on P-type silicon or germanium.

Referring to Fig. 3, a silicon body 30 having a thickness of the order of .025″ and a diameter of approximately 1″, which has been cut and etched as described hereinbefore, is placed on the heating platform 16 beneath the first and second filaments 24, 25. The vacuum chamber is sealed and evacuated to a pressure of approximately $10^{-4}$ millimeters of mercury by the vacuum pump 14. The temperature of the heating platform 16 is raised by means of the source of electric current 20 until the upper surface of the silicon body is at a temperature above the eutectic temperature of gold-antimony-silicon, which is 370° C. In this embodiment, a temperature of approximately 500° C. is used.

The first filament 24 is raised in temperature by means of the source of electric current 26. A current of approximately 20 amperes is used to heat the filament sufficiently to cause the gold-antimony to wet the tungsten. The current is then raised to approximately 30 amperes, causing the gold-antimony to evaporate from the filament and deposit on the upper surface of the silicon body 30 as shown at 34 in Fig. 3. It has been found that the rate of evaporation onto the surface of the silicon body is not important in effecting the final ohmic contact, although at the amperage given above, the rate of evaporation is approximately 2/100 mg./cm.$^2$/sec. Therefore, the time required to evaporate the gold-antimony onto the silicon surface is not critical in forming the ohmic contact and it has been found that the thickness of the evaporated layer 34 need not be greater than approximately 500 Angstrom units since a film of this thickness produces substantially perfect ohmic contact over any desired area. It is for this reason that a single evaporation stage is used to form the ohmic contact since uneven deposits are not encountered in such a thin film of metal to be deposited. The film thickness is calculated from measurements which show the evaporation of approximately 2 mg./cm.$^2$ of material onto the silicon surface. For the purpose of providing an ohmic contact, it is necessary only that there be fusion between the solvent metal and the semiconductor body to insure electrical continuity. The antimony, or active impurity of the conductivity type opposite to that used to form the fused junction, is used to prevent the possibility of providing another rectifying junction besides the rectifying junction that is to be formed. After evaporation of the gold-antimony from the first filament 24 onto the N-type silicon crystal to provide the ohmic contact 34, the silicon is allowed to cool to room temperature preferably at a controlled rate of cooling.

The silicon body is then turned over on the heating platform 16 and a substantial thickness of aluminum is evaporated onto the surface of the N-type silicon body opposite to the surface to which the ohmic contact 34 has been affixed. In order to insure a uniform deposit of molten solvent metal, the aluminum or combined solvent metal and active impurity is evaporated onto the silicon body in two stages of evaporation with a cooling cycle to a temperature below the aluminum-silicon eutectic temperature and a reheating to a temperature above the eutectic temperature between evaporation stages, as described hereinbefore, to form a P-N junction and regrown P-type crystal region 32. The three critical parameters of fusion temperature, rate of evaporation, and thickness of the aluminum evaporated onto the silicon surface must be observed. The regrown P-type crystal region is of the order of 1.5 mils in the present embodiment. The aluminum-silicon eutectic layer 33 of approximately 4.5 mils thickness is used as an ohmic connection to the regrown crystal region 32.

After creating the ohmic contact 34 and regrown crystal region 32 on the N-type silicon region 31, the silicon body 30 may be divided into a plurality of silicon bodies having rectifying areas of any predetermined size or the complete semiconductor body may be used to produce a diode having a rectifying area equal to the total area of the P-N junction used. For example, a silicon body used in the illustrative embodiment may be cut or diced into squares which are ⅛″ on a side to produce forty semiconductor diodes or rectifiers. However, if the complete semiconductor body is utilized to produce a power rectifying diode having a rectifying area 1″ in diameter, a conductor may be readily affixed to the surface of the aluminum-silicon eutectic layer 33 by means well known to the art. The difficulty encountered in prior art devices in making ohmic contact to the regrown region are avoided since the layer of aluminum-silicon eutectic formed by the method of the present invention makes excellent ohmic contact with the regrown region to which it is affixed.

It will be apparent to one skilled in the art that the method disclosed herein for the formation of fused P-N junctions and ohmic contacts may be utilized to produce other fused junction semiconductor devices and is especially adaptable to the production of high power fused junction transistors as disclosed and claimed in the copending application of Maserjian. The use of the method is especially advantageous in the production of fused junction transistors having very close spacing between the emitter and collector regions, due to the precision control of the thickness of the regrown crystal region and the exceptionally planar fused junction. Transistors with such configurations are desired because of their excellent characteristics, particularly for high current application.

Although, in the foregoing description, the formation of fused P-N junctions using silicon bodies and aluminum as a combined solvent metal and active impurity has been particularly described, it will be apparent to those skilled in the art that other metals may be used as solvent metals, including gold, platinum, silver, and tin. The active impurity combined with or present in the solvent metal may also be varied according to the use of the metal and the semiconductor devices desired, in that donor impurities such as phosphorus, arsenic, and antimony, may be used to produce an N-type regrown region on a P-type semiconductor body, while acceptor impurities, such as boron, aluminum, gallium, and indium, may be used to produce fused P-N junctions on N-type semiconductor bodies.

Thus, the method disclosed herein is a modification of the evaporation-fused method disclosed by the Maserjian application above identified, and insures the even and uniform deposit of a solvent metal which is deposited upon the surfaces of a semi-conductor body to form a fused P-N junction. The method of the present invention provides fused P-N junctions which are exceptionally planar in configuration.

What is claimed is:

1. The method of producing an integral regrown crystal region of one conductivity type upon a surface of a semiconductor crystal body having a predetermined conductivity type comprising: evaporating a first molten layer of substantial thickness of solvent metal containing an active impurity upon said surface of said semiconductor body, said surface of said semiconductor body being at a temperature above the eutectic temperature of said solvent metal and said semiconductor material, said active impurity being of a type which determines the conductivity type of the integral regrown crystal region; cooling said semiconductor body to a temperature below said eutectic temperature of said solvent metal and said semiconductor body; raising said semiconductor body to a temperature above said eutectic temperature of said solvent metal and said semiconductor material; evaporating a second molten layer of substantial thickness of solvent metal containing an active impurity upon said surface of said semiconductor body; and cooling said semiconductor body to cause the dissolved semiconductor material to precipitate, together with some atoms of said active impurity, upon said semiconductor body to form an integral regrown crystal region of a conductivity type opposite to that of said semiconductor body.

2. The method of producing an integral P-type regrown region upon a surface of an N-type monatomic semiconductor crystal body comprising: evaporating a first molten layer of substantial thickness of solvent metal containing an active impurity upon said surface of said semiconductor body, said surface of said semiconductor body being at a temperature above the eutectic temperature of said solvent metal and said semi-conductor material, said active impurity being selected from the group consisting of aluminum, gallium, and indium; cooling said semiconductor body to a temperature below said eutectic temperature; raising the temperature of said semiconductor body to a temperature above said eutectic temperature; evaporating a second molten layer of substantial thickness of said solvent metal containing said active impurity upon said surface of said semiconductor body; and cooling said semiconductor body to cause dissolved semiconductor material to precipitate, together with some atoms of said active impurity, upon said semiconductor body to form an integral P-type regrown crystal region upon said N-type semiconductor body.

3. The method of producing an integral N-type regrown crystal region upon a surface of a P-type semiconductor crystal body comprising: evaporating a first molten layer of substantial thickness of solvent metal containing an active impurity upon said surface of said semiconductor body, said surface of said semiconductor body being at a temperature above the eutectic temperature of said solvent metal and said semiconductor material, said active impurity being selected from the group consisting of antimony, arsenic, and phosphorus; cooling said semiconductor body to a temperature below said eutectic temperature; raising the temperature of said semiconductor body to a temperature above said eutectic temperature; evaporating a second molten layer of substantial thickness of said solvent metal containing said active impurity upon said surface of said semiconductor body; and cooling said semiconductor body to cause the dissolved semiconductor material to precipitate, together with some atoms of said active impurity upon said P-type semiconductor body to form an N-type integral regrown crystal region.

4. The method of producing an integral regrown crystal region of one conductivity type upon a surface of a monatomic semiconductor crystal body of opposite conductivity type comprising: evaporating a first molten layer of substantial thickness of solvent metal upon said surface of said semiconductor body, said surface of said semiconductor body being at a temperature above the eutectic temperature of said solvent metal and said semiconductor material, said solvent metal being an active impurity of a type which determines the conductivity type of the integral regrown region; cooling said semiconductor body to a temperature below said eutectic temperature; heating said semiconductor body to a temperature above said eutectic temperature; evaporating a second molten layer of substantial thickness of said solvent metal upon said surface of said semiconductor body; and cooling said semiconductor body to cause the dissolved semiconductor body to precipitate, together with some atoms of said combined solvent metal and active impurity, upon said semiconductor body to form an integral regrown crystal region of a conductivity type opposite to that of said semiconductor body.

5. The method of producing an integral P-type regrown crystal region upon a surface of an N-type semiconductor crystal body comprising: evaporating a first molten layer of substantial thickness of aluminum upon said surface of said semiconductor body, said surface of said semiconductor body being at a temperature above the eutectic temperature of said semiconductor material and aluminum; cooling said semiconductor body and said deposited aluminum to a temperature below said eutectic temperature; heating said semiconductor body and said deposited aluminum to said temperature above said eutectic themperature; evaporating a second molten layer of substantial thickness of aluminum upon said surface of said semiconductor body and said first evaporated layer of aluminum; and cooling said semiconductor body to cause the dissolved semiconductor material to precipitate, together with some atoms of said aluminum, upon said semiconductor body to form an integral P-type regrown crystal region upon said N-type semiconductor body.

6. The method of producing an integral regrown crystal region of one conductivity type upon the surface of a semiconductor crystal body having a predetermined conductivity type, comprising the steps of: positioning a first and second mass of solvent metal containing an active impurity proximate a surface of said semiconductor body, said active impurity being of a type which determines the conductivity type of the integral regrown crystal region; heating said semiconductor body to a temperature above the eutectic temperature of the material of said semiconductor body and said solvent metal and below the melting point of said material of said semiconductor body; evaporating said first mass of solvent metal onto the surface of said semiconductor body to form a first molten layer of substantial thickness of said solvent metal on said surface; cooling said semiconductor body and said first layer of solvent metal to a temperature below said eutectic temperature; heating said semiconductor body and said first layer of solvent metal to a temperature above said eutectic temperature; evaporating said second mass of solvent metal onto the surface of said semiconductor body and said first layer of solvent metal to form a second molten layer of substantial thickness of said solvent metal on said surface, whereby a layer of said surface of said semiconductor body is dissolved in said layers of solvent metal; and cooling said semiconductor body to cause the dissolved semiconductor material to precipitate, together with some atoms of the active impurity, upon said semiconductor body to form an integral regrown crystal region of a conductivity type opposite to that of said semiconductor body.

7. The method of producing an integral P-type regrown crystal region upon a surface of an N-type monatomic semiconductor crystal body comprising the steps of: positioning a first and second mass of solvent metal containing an active impurity proximate a surface of said semiconductor body, said active impurity being selected from the group consisting of aluminum, gallium, and indium; heating said semiconductor body to a temperature above the eutectic temperature of the material of said semiconductor body and said solvent metal and below the melting point of said material of said semiconductor body; evaporating said first mass of solvent metal onto said surface of said semiconductor body to form a first molten layer of substantial thickness of said solvent metal on said surface; cooling said semconductor body and said first layer of solvent metal to a temperature below said eutectic temperature; heating said semiconductor body and said first layer of solvent metal to a temperature above said eutectic temperature; evaporating said second mass of solvent metal onto said surface of said semiconductor body and said first layer of solvent metal, whereby a layer of said surface of said semiconductor body is dissolved in said molten layers of solvent metal; and cooling said semiconductor body to cause the dissolved semiconductor material to precipitate, together with some atoms of the active impurity, upon the N-type semiconductor body to form a P-type integral regrown crystal region.

8. The method of producing an integral N-type regrown crystal region upon a surface of a P-type semiconductor crystal body, comprising the steps of: positioning a first and second mass of solvent metal containing an active impurity proximate a surface of said semiconductor body, said active impurity being selected from the group consisting of antimony, arsenic, and phosphorus; heating said semiconductor body to a temperature above the eutectic temperature of the material of said semiconductor body and said solvent metal and below the melting point of said material of said semiconductor body; evaporating said first mass of solvent metal onto said surface of said semiconductor body to form a first molten layer of substantial thickness of said solvent metal on said surface; cooling said semiconductor body and said first layer of solvent metal to a temperature below said eutectic temperature; heating said semiconductor body and said first layer of solvent metal to a temperature above said eutectic temperature; evaporating said second mass of solvent metal onto said surface of said semiconductor body and said first layer of solvent metal, whereby a layer of said surface of said semiconductor body is dissolved in the molten layers of solvent metal; and cooling said semiconductor body to cause the dissolved semiconductor material to precipitate, together with atoms of the active impurity, upon the P-type semiconductor body to form an N-type integral regrown crystal region.

9. The method of producing an integral regrown crystal region upon a surface of a monatomic semiconductor crystal body having a conductivity type opposite to that of the regrown crystal region, comprising the steps of: positioning a first and second mass of solvent metal proximate a surface of said semiconductor body, said solvent metal being an active impurity of a type which determines the conductivity type of the integral regrown crystal region; heating said semiconductor body to a temperature above the eutectic temperature of the material of said semiconductor body and said solvent metal and below the melting point of the material of said semiconductor body; evaporating said first mass of solvent metal onto the surface of said semiconductor body to form a first molten layer of substantial thickness of said solvent metal on said surface; cooling said semiconductor body and said first layer of solvent metal to a temperature below said eutectic temperature; heating said semiconductor body and said first layer of solvent metal to a temperature above said eutectic temperature; evaporating said second mass of solvent metal onto said surface of said semiconductor body and said first layer of solvent metal, whereby a layer of said surface of said semiconductor body is dissolved in the molten layers of solvent metal; and cooling said semiconductor body to cause said dissolved semiconductor material to precipitate, together with atoms of said solvent metal, upon said semiconductor body to form an integral regrown crystal region of a conductivity type opposite to that of said semiconductor body.

10. The method of producing an integral P-type regrown crystal region upon a surface of an N-type monatomic semiconductor crystal body, comprising the steps of: positioning a first and second mass of aluminum proximate a surface of said semiconductor body, heating said semiconductor body to a temperature above the eutectic temperature of the material of said semiconductor body and said aluminum and below the melting point of the material of said semiconductor body; evaporating said first mass of aluminum onto said surface of said semiconductor body to form a first molten layer of substantial thickness of said aluminum on said surface; cooling said semiconductor body to a temperature below said eutectic temperature; heating said semiconductor body and said first layer of solvent metal to a temperature above said eutectic temperature; evaporating said second mass of aluminum onto said surface of said semiconductor body to form a second molten layer of substantial thickness of said aluminum on said surface, whereby a layer of said surface of said semiconductor body is dissolved in the combined layers of aluminum; and cooling said semiconductor body to cause the dissolved semiconductor material to precipitate, together with atoms of said aluminum, upon said N-type semiconductor body to form an integral P-type regrown crystal region.

11. The method of producing an integral P-type regrown crystal region upon a surface of an N-type silicon body, comprising the steps of: positioning a first and second mass of aluminum proximate a surface of said silicon body, heating said silicon body to a temperature above the eutectic temperature of said silicon body and said aluminum and below the melting point of said silicon body; evaporating said first mass of aluminum onto said surface of said silicon body to form a first molten layer of substantial thickness of said aluminum on said surface; cooling said silicon body to a temperature below said eutectic temperature; heating said silicon body and said first layer of solvent metal to a temperature above said eutectic temperature; evaporating said second mass of aluminum onto said surface of said silicon body to form a second molten layer of substantial thickness of said aluminum on said surface, whereby a layer of said surface of said silicon body is dissolved in the combined layers of aluminum; and cooling said silicon body to cause the dissolved silicon to precipitate, together with atoms of said aluminum, upon said N-type silicon body to form an integral P-type regrown crystal region.

12. The method of producing a broad area fused P-N junction upon an N-type silicon crystal body, comprising the steps of: positioning a first and second mass of aluminum proximate a surface of said silicon body, heating said silicon body to a temperature above the eutectic temperature of silicon and aluminum and below the melting point of silicon; evaporating said first mass of aluminum onto said surface of said silicon body to form a first molten layer of aluminum upon said surface, said first molten layer having a thickness of at least 0.2 mil, said aluminum being evaporated at a predetermined rate of deposition upon said surface of at least .01 mil per second; cooling said silicon body to a temperature below said eutectic temperature; heating said silicon body and said first layer of aluminum to a temperature above said eutectic temperature; evaporating said second mass of aluminum onto said surface of said silicon body and said first layer of aluminum, to form a second molten layer of aluminum having a thickness of at least 0.2 mil, said aluminum being evaporated at said predetermined rate of deposition, whereby a layer of the surface of said silicon body is dissolved in said molten layers of aluminum; and cooling said silicon body to cause the dissolved silicon to precipitate, together with atoms of aluminum, upon said silicon body to form a P-type integral regrown crystal region and a layer of aluminum-silicon eutectic ohmically affixed to said P-type regrown region.

13. The method of producing a broad area fused P-N junction upon an N-type silicon body comprising the steps of: positioning a first and second mass of aluminum, proximate a surface of said silicon body; heating said silicon body to a temperature in the range of approximately 700° C. to 900° C.; evaporating said first mass of aluminum onto said surface of said silicon body to form a first molten layer of aluminum upon said surface, said first molten layer being of a thickness between 0.2 mil and 10 mils, said aluminum being evaporated at a predetermined rate of deposition upon said surface of at least .01 mil in thickness per second; cooling said silicon body to a temperature below said eutectic temperature; heating said silicon body and said first layer of aluminum to a temperature above said eutectic temperature; evaporating said second mass of aluminum onto said surface of said silicon body and said first layer of aluminum to form a second molten layer of aluminum being of a thickness between 0.2 mil and 10 mils, said aluminum being deposited at said predetermined rate of deposition, whereby a layer of the surface of said silicon body is dissolved in said molten layers of aluminum; and cooling said silicon body to cause the dissolved slicon to precipitate, together with atoms of aluminum, upon said silicon body to form an integral P-type regrown crystal region.

References Cited in the file of this patent

UNITED STATES PATENTS

| | | |
|---|---|---|
| 2,695,852 | Sparks | Nov. 30, 1954 |
| 2,701,326 | Pfann et al. | Feb. 1, 1955 |
| 2,736,847 | Barnes | Feb. 28, 1956 |